US012727409B2

(12) United States Patent
Zhou et al.

(10) Patent No.: US 12,727,409 B2
(45) Date of Patent: Sep. 1, 2026

(54) IN-SITU CARBON LINER FOR HIGH ASPECT RATIO FEATURES

(71) Applicant: Applied Materials, Inc., Santa Clara, CA (US)

(72) Inventors: Hailong Zhou, San Jose, CA (US); Iljo Kwak, Santa Clara, CA (US); Olivier P. Joubert, Meylan (FR); Yu Wen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 528 days.

(21) Appl. No.: 17/949,083

(22) Filed: Sep. 20, 2022

(65) Prior Publication Data

US 2024/0096641 A1 Mar. 21, 2024

(51) Int. Cl.

| | |
|---|---|
| ***H10P 50/28*** | (2026.01) |
| ***H01J 37/32*** | (2006.01) |
| ***H10B 69/00*** | (2023.01) |

(52) U.S. Cl.

CPC ...... *H10P 50/283* (2026.01); *H01J 37/32146* (2013.01); *H01J 37/32477* (2013.01); (Continued)

(58) Field of Classification Search

CPC ......... H01L 21/31116; H01L 21/31122; H01L 21/31144; H10P 50/283; H10P 50/285; H10P 50/73

See application file for complete search history.

(56) References Cited

U.S. PATENT DOCUMENTS 6,071,822 A * 6/2000 Donohue ............ B81C 1/00571 438/719
2012/0196447 A1 8/2012 Yang et al.
(Continued)

FOREIGN PATENT DOCUMENTS

JP 2002518825 A 6/2002
JP 2007210864 A 8/2007
(Continued)

OTHER PUBLICATIONS

Notice of Decision to Grant for Taiwan Appln No. 112135801 dated Aug. 9, 2024, 6 pages.
Notice of Decision to Grant for Taiwan Appln No. 113133215 dated Nov. 15, 2024, 6 pages.
Application No. PCT/US2023/073917 , International Search Report and Written Opinion, Mailed on Dec. 27, 2023, 12 pages.
(Continued)

*Primary Examiner* — Syed I Gheyas

(74) *Attorney, Agent, or Firm* — Kilpatrick Townsend & Stockton LLP

(57) ABSTRACT

Exemplary methods of semiconductor processing may include etching a first portion of a feature in a substrate disposed within a processing region of a semiconductor processing chamber. The first portion of the feature may at least partially extend through one or more layers of material formed on the substrate. The methods may include providing a carbon-containing precursor to the processing region of the semiconductor processing chamber. The methods may include generating plasma effluents of the carbon-containing precursor. The methods may include contacting the substrate with the plasma effluents of the carbon-containing precursor. The methods may include forming a carbon-containing material on the substrate. The carbon-containing material may line the first portion of the feature at least partially extending through the one or more layers of material formed on the substrate. The carbon-containing material may be formed in the same chamber where the feature is etched.

19 Claims, 6 Drawing Sheets

(52) U.S. Cl.
CPC .. *H01J 37/32522* (2013.01); *H01J 37/32816* (2013.01); *H10B 69/00* (2023.02); *H01J 2237/182* (2013.01); *H01J 2237/334* (2013.01)

(56) References Cited

U.S. PATENT DOCUMENTS

| | | | | |
|---|---|---|---|---|
| 2014/0273462 | A1* | 9/2014 | Simsek-Ege | H01L 21/0335 438/696 |
| 2016/0099173 | A1* | 4/2016 | Agarwal | H01L 21/02071 438/714 |
| 2016/0163558 | A1* | 6/2016 | Hudson | H01L 21/31116 156/345.24 |
| 2016/0293609 | A1 | 10/2016 | Jha et al. | |
| 2017/0365487 | A1 | 12/2017 | Shen et al. | |

FOREIGN PATENT DOCUMENTS

| | | | |
|---|---|---|---|
| JP | 2020533809 | A | 11/2020 |
| JP | 2021077843 | A | 5/2021 |
| JP | 2021534589 | A | 12/2021 |
| JP | 2022040090 | A | 3/2022 |
| TW | 202217925 | A | 5/2022 |

OTHER PUBLICATIONS

Japanese Application No. 2025-515998, Office Action mailed on Feb. 10, 2026, 13 pages (6 pages of original document and 7 pages of English Translation).

KR10-2025-7012682, “Office Action”, Jul. 1, 2026, 21 pages.

* cited by examiner

IN-SITU CARBON LINER FOR HIGH ASPECT RATIO FEATURES

TECHNICAL FIELD

The present technology relates to semiconductor processes and materials. More specifically, the present technology relates to forming protective layers during processing to etch through a stack of material layers.

BACKGROUND

Integrated circuits are made possible by processes which produce intricately patterned material layers on substrate surfaces. Producing patterned material on a substrate requires controlled methods of formation and removal of exposed material. Stacked memory, such as vertical or 3D NAND, may include the formation of a series of alternating layers of dielectric materials through which a number of memory holes or apertures may be etched. Material properties of the layers of materials, as well as process conditions and materials for etching, may affect the uniformity of the formed structures. Resistance to etchants may lead to inconsistent patterning, which may further affect the uniformity of the formed structures.

Thus, there is a need for improved systems and methods that can be used to produce high quality devices and structures. These and other needs are addressed by the present technology.

SUMMARY

Exemplary methods of semiconductor processing may include etching a first portion of a feature in a substrate disposed within a processing region of a semiconductor processing chamber. The first portion of the feature may at least partially extend through one or more layers of material formed on the substrate. The methods may include providing a carbon-containing precursor to the processing region of the semiconductor processing chamber. The methods may include generating plasma effluents of the carbon-containing precursor. The methods may include contacting the substrate with the plasma effluents of the carbon-containing precursor. The methods may include forming a carbon-containing material on the substrate. The carbon-containing material may line the first portion of the feature at least partially extending through the one or more layers of material formed on the substrate. The carbon-containing material may be formed in the same chamber where the feature is etched.

In some embodiments, the feature is characterized by an aspect ratio of greater than or about 10:1. The one or more layers of material formed on the substrate may include alternating layers of oxide material and nitride material. The methods may include, subsequent to etching the first portion of the feature in the substrate, providing an oxygen-containing precursor. The methods may include contacting the substrate with the oxygen-containing precursor. The contacting may remove etchant byproducts in or above the feature. The methods may include generating plasma effluents of the oxygen-containing precursor. The carbon-containing precursor may be or include a fluorocarbon. The plasma effluents of the carbon-containing precursor may be generated at a plasma power of less than or about 2,000 W. The methods may include applying a bias power while forming the carbon-containing material on the substrate. The bias power may direct the carbon-containing material to an etch front of the feature. The methods may include providing an oxygen-containing precursor with the carbon-containing precursor. The oxygen-containing precursor may be molecular oxygen. A temperature within the processing region may be maintained at less than or about 150° C. during the semiconductor processing method. A pressure within the processing region may be maintained at less than or about 500 mTorr during the semiconductor processing method.

Some embodiments of the present technology encompass semiconductor processing methods. The methods may include i) providing one or more etchant precursors to a processing region of a semiconductor processing chamber. A substrate may be disposed within the processing region of the semiconductor processing chamber. The methods may include ii) generating plasma effluents of the one or more etchant precursors. The methods may include iii) etching a first portion of a feature in the substrate disposed within the processing region. The first portion of the feature may at least partially extend through one or more layers of material formed on the substrate. The methods may include iv) providing a flashing precursor to the processing region of the semiconductor processing chamber. The methods may include v) removing etchant byproducts from the substrate. The methods may include vi) providing a carbon-containing precursor to the processing region of the semiconductor processing chamber. The methods may include vii) generating plasma effluents of the carbon-containing precursor. The methods may include viii) forming a carbon-containing material on the substrate. The carbon-containing material may line the first portion of the feature at least partially extending through the one or more layers of material formed on the substrate. The methods may include ix) repeating operations i) through viii) for at least five cycles.

In some embodiments, the one or more etchant precursors may include an oxygen-containing precursor and a fluorine-containing precursor. The carbon-containing precursor may include a carbon-hydrogen-and-fluorine-containing precursor. The methods may include providing argon to the processing region of the processing region while providing the flashing precursor or providing the carbon-containing precursor. A critical dimension of the feature may be less than or about 550 nm. The methods may include pulsing a plasma power during any of operations i) through viii), wherein a frequency of the plasma power is less than or about 500 Hz.

Some embodiments of the present technology encompass semiconductor processing methods. The methods may include etching a feature in a substrate disposed within a processing region of a semiconductor processing chamber. The feature may at least partially extend through one or more alternating layers of material formed on the substrate. The methods may include providing a fluorocarbon precursor to the processing region of the semiconductor processing chamber. The methods may include generating plasma effluents of the fluorocarbon precursor. The plasma effluents of the fluorocarbon precursor may be generated at a plasma power of less than or about 1,500 W. The methods may include contacting the substrate with the plasma effluents of the fluorocarbon precursor. The methods may include forming a polymeric carbon-containing material on the substrate. The polymeric carbon-containing material may line the feature at least partially extending through the one or more alternating layers of material formed on the substrate.

In some embodiments, the substrate comprises a mask material overlying the one or more alternating layers of material. A thickness of the polymeric carbon-containing material may be less than or about 30 nm. The feature may be characterized by an aspect ratio of greater than or about 40:1.

Such technology may provide numerous benefits over conventional systems and techniques. For example, the processes and structures may protect against defect formation during etching operations. Additionally, the operations of embodiments of the present technology may improve memory hole formation through the stacks allowing more layer pairs to be etched during processing. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
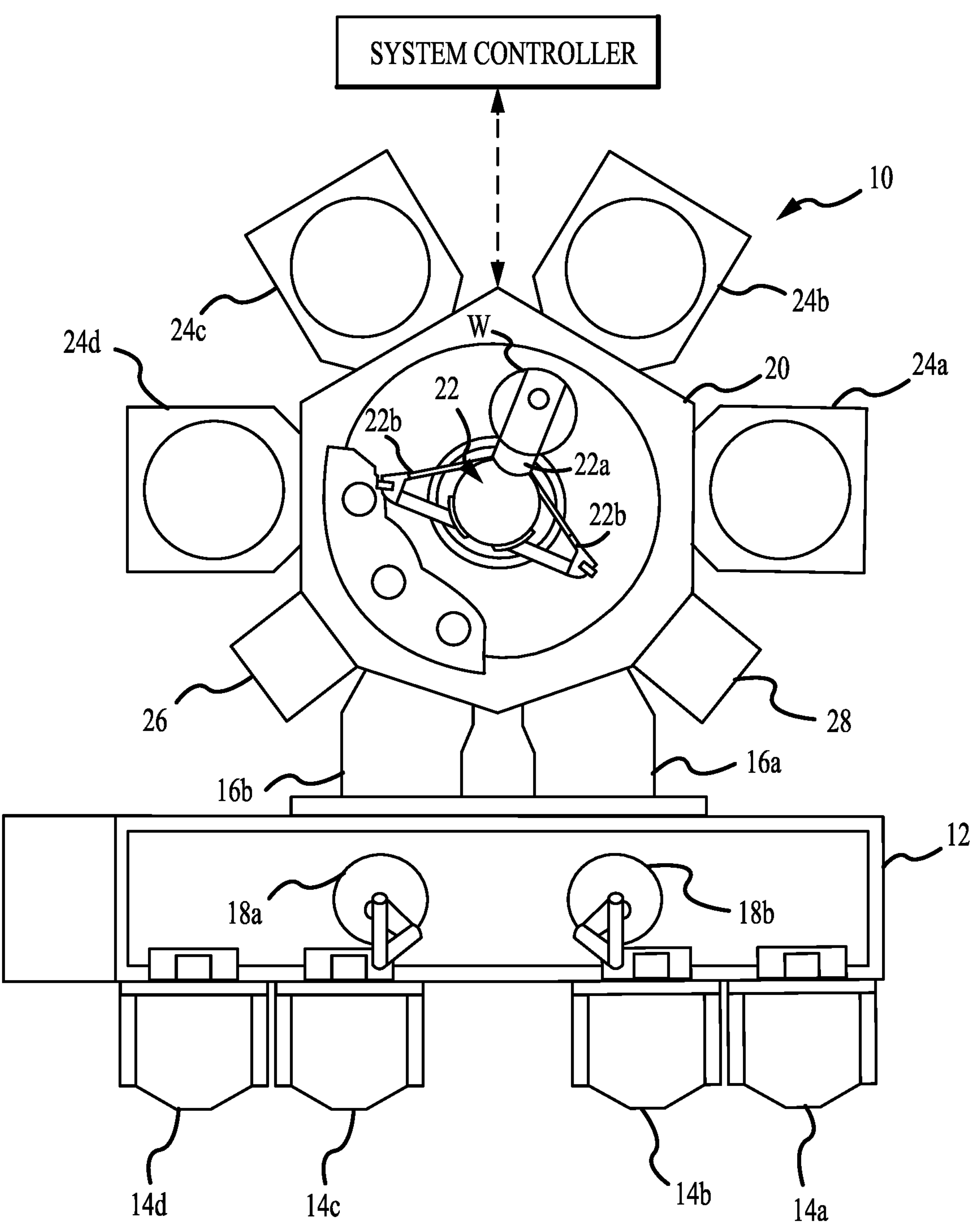
FIG. 1 shows a schematic top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include superfluous or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As 3D NAND structures grow in the number of cells being formed, the aspect ratios of memory holes and other structures increase, sometimes dramatically. During 3D NAND processing, stacks of placeholder layers and dielectric materials may initially be formed, and within which the memory cells may be formed. These placeholder layers may have a variety of operations performed to place structures before fully removing the material and replacing it with metal. The layers are often formed overlying a conductor layer, such as polysilicon, for example. When the memory holes are formed, apertures may extend through all of the alternating layers of material before accessing the polysilicon or other material substrate. Subsequent processing may form a staircase structure for contacts, and may also exhume the placeholder materials laterally.

A reactive-ion etching ("RIE") operation may be performed to produce the high aspect ratio memory holes. The RIE process often involves a combination chemical and physical removal of the alternating layers. As one non-limiting example, where the alternating layers may include silicon oxide and silicon nitride, the silicon oxide may be removed to a greater degree by physical bombardment of the layer during the RIE, and the silicon nitride may be removed to a greater degree by chemical reaction of the RIE precursors with the nitride materials.

Conventional technologies may struggle with uniformity and control during the memory hole formation due to material differences between the two layer types, as well as the RIE process and materials. Additionally, the memory hole may extend outward during etching, causing widening of a critical dimension within the stacked layer structure through which RIE may be performed to produce memory holes. Bowing may occur anywhere throughout a structure, and may be caused by a number of issues. For example, bowing may be caused by limited passivation on sidewalls, which may allow an amount of lateral etch to occur. Bowing may also occur due to changes with a hardmask material or other structural features. For example, if edges of a hardmask may become eroded during RIE processes, ions may be projected into the feature or memory hole at different directions or angles from normal to the substrate, which may produce additional lateral etching within some regions of the structure until the hardmask taper is removed or etched away.

To compensate for these issues, conventional technologies have been limited in the number of stack layer pairs that can be etched at any time. As the number of layers increases, many conventional technologies will produce the structure in two discrete cycles. For example, conventional technologies may produce a first set of layers and etch through these layers. The memory holes may be plugged, and a second set of layers may be formed overlying the first set. The second set of layers may then be etched as well as the plug in the first set, with the intention of fully forming the structure. However, aligning the holes between the sets is rarely perfect, causing offsets that can affect production and cell formation. Additionally, by halting the formation between sets, material differences may develop due to different exposure and processing levels.

The present technology overcomes these issues by forming a liner layer of carbon-containing material, which may be a polymeric material. Unlike conventional technologies, the present technology may allow the complete set of layer pairs to be formed, which may include over one hundred layers or more. The process may then separate the etching operation into two parts, where a liner may be deposited over initially etched material to limit over-etching as a second etch operation is performed to fully penetrate the stack of layers. This may suppress the lateral etching on the sidewall and minimize any widening of the critical dimension of the feature. Additionally, this may ensure the etch operation is fully aligned through the stack of layers, while allowing further scaling of the number of layer pairs that can be processed.

Although the remaining disclosure will routinely identify specific materials and semiconductor structures utilizing the disclosed technology, it will be readily understood that the systems, methods, and materials are equally applicable to a number of other structures that may benefit from aspects of the present technology. Accordingly, the technology should not be considered to be so limited as for use with 3D NAND processes or materials alone. Moreover, although an exemplary chamber is described to provide foundation for the present technology, it is to be understood that the present technology can be applied to virtually any semiconductor processing chamber that may allow the operations described.

FIG. 1 shows a top plan view of one embodiment of a processing system 10 of deposition, etching, baking, and/or curing chambers according to embodiments. The tool or processing system 10 depicted in FIG. 1 may contain a plurality of process chambers, 24*a*-*d*, a transfer chamber 20, a service chamber 26, an integrated metrology chamber 28, and a pair of load lock chambers 16*a*-*b*. The process chambers may include any number of structures or components, as well as any number or combination of processing chambers.

To transport substrates among the chambers, the transfer chamber 20 may contain a robotic transport mechanism 22. The transport mechanism 22 may have a pair of substrate transport blades 22*a* attached to the distal ends of extendible arms 22*b*, respectively. The blades 22*a* may be used for carrying individual substrates to and from the process chambers. In operation, one of the substrate transport blades such as blade 22*a* of the transport mechanism 22 may retrieve a substrate W from one of the load lock chambers such as chambers 16*a*-*b* and carry substrate W to a first stage of processing, for example, a treatment process as described below in chambers 24*a*-*d*. The chambers may be included to perform individual or combined operations of the described technology. For example, while one or more chambers may be configured to perform a deposition or etching operation, one or more other chambers may be configured to perform a pre-treatment operation and/or one or more post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 22*a* and may insert a new substrate with a second blade. Once the substrate is processed, it may then be moved to a second stage of processing. For each move, the transport mechanism 22 generally may have one blade carrying a substrate and one blade empty to execute a substrate exchange. The transport mechanism 22 may wait at each chamber until an exchange can be accomplished.

Once processing is complete within the process chambers, the transport mechanism 22 may move the substrate W from the last process chamber and transport the substrate W to a cassette within the load lock chambers 16*a*-*b*. From the load lock chambers 16*a*-*b*, the substrate may move into a factory interface 12. The factory interface 12 generally may operate to transfer substrates between pod loaders 14*a*-*d* in an atmospheric pressure clean environment and the load lock chambers 16*a*-*b*. The clean environment in factory interface 12 may be generally provided through air filtration processes, such as HEPA filtration, for example. Factory interface 12 may also include a substrate orienter/aligner that may be used to properly align the substrates prior to processing. At least one substrate robot, such as robots 18*a*-*b*, may be positioned in factory interface 12 to transport substrates between various positions/locations within factory interface 12 and to other locations in communication therewith. Robots 18*a*-*b* may be configured to travel along a track system within factory interface 12 from a first end to a second end of the factory interface 12.

The processing system 10 may further include an integrated metrology chamber 28 to provide control signals, which may provide adaptive control over any of the processes being performed in the processing chambers. The integrated metrology chamber 28 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 24*a*-*d* may be configured to perform one or more process steps in the fabrication of a semiconductor structure, and any number of processing chambers and combinations of processing chambers may be used on multi-chamber processing system 10. For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be metal deposition, surface cleaning and preparation, thermal annealing such as rapid thermal processing, and plasma processing. Any other processes may similarly be performed in specific chambers incorporated into multi-chamber processing system 10, including any process described below, as would be readily appreciated by the skilled artisan.

Figure 2:
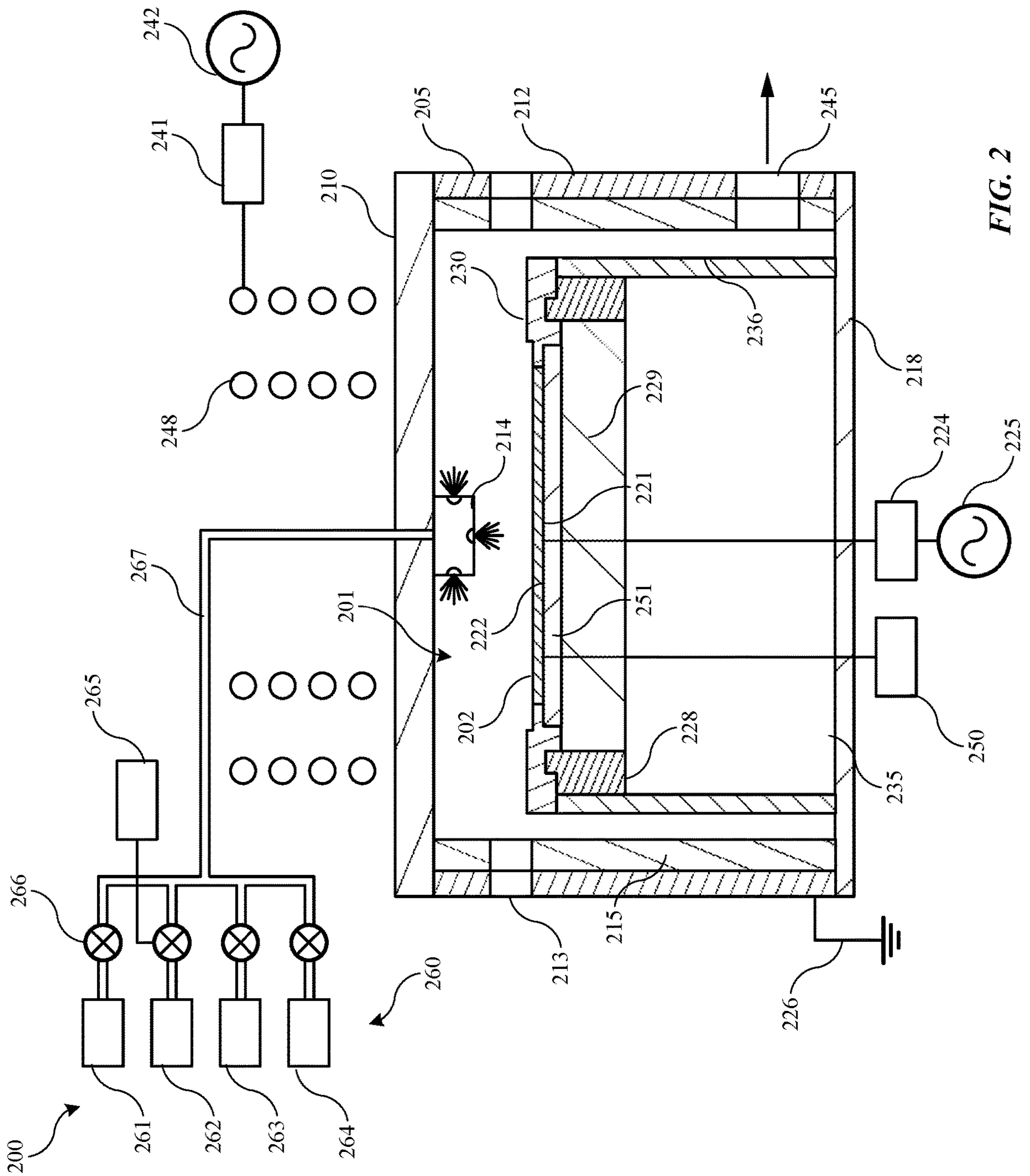
FIG. 2 shows a schematic cross-sectional view of an exemplary processing system according to some embodiments of the present technology.

FIG. 2 illustrates a schematic cross-sectional view of an exemplary processing chamber 200 suitable for patterning a material layer disposed on a substrate 202 in the processing chamber 200. The exemplary processing chamber 200 is suitable for performing a patterning process, although it is to be understood that aspects of the present technology may be performed in any number of chambers, and substrate supports according to the present technology may be included in etching chambers, deposition chambers, treatment chambers, or any other processing chamber. The plasma processing chamber 200 may include a chamber body 205 defining a chamber volume 201 in which a substrate may be processed. The chamber body 205 may have sidewalls 212 and a bottom 218 which are coupled with ground 226. The sidewalls 212 may have a liner 215 to protect the sidewalls 212 and extend the time between maintenance cycles of the plasma processing chamber 200. The dimensions of the chamber body 205 and related components of the plasma processing chamber 200 are not limited and generally may be proportionally larger than the size of the substrate 202 to be processed therein. Examples of substrate sizes include 200 mm diameter, 250 mm diameter, 300 mm diameter and 450 mm diameter, among others, such as display or solar cell substrates as well.

The chamber body 205 may support a chamber lid assembly 210 to enclose the chamber volume 201. The chamber body 205 may be fabricated from aluminum or other suitable materials. A substrate access port 213 may be formed through the sidewall 212 of the chamber body 205, facilitating the transfer of the substrate 202 into and out of the plasma processing chamber 200. The access port 213 may be coupled with a transfer chamber and/or other chambers of a substrate processing system as previously described. A pumping port 245 may be formed through the sidewall 212 of the chamber body 205 and connected to the chamber volume 201. A pumping device may be coupled through the pumping port 245 to the chamber volume 201 to evacuate and control the pressure within the processing volume. The pumping device may include one or more pumps and throttle valves.

A gas panel 260 may be coupled by a gas line 267 with the chamber body 205 to supply process gases into the chamber volume 201. The gas panel 260 may include one or more process gas sources 261, 262, 263, 264 and may additionally include inert gases, non-reactive gases, and reactive gases, as may be utilized for any number of processes. Examples of process gases that may be provided by the gas panel 260 include, but are not limited to, hydrocarbon containing gas including methane, sulfur hexafluoride, silicon chloride, carbon tetrafluoride, hydrogen bromide, hydrocarbon containing gas, argon gas, chlorine, nitrogen, helium, or oxygen gas, as well as any number of additional materials. Additionally, process gasses may include nitrogen, chlorine, fluorine, oxygen, and hydrogen containing gases such as $BCl_3$, $C_2F_4$, $C_4F_8$, $C_4F_6$, $CHF_3$, $CH_2F_2$, $CH_3F$, $NF_3$, $NH_3$, $CO_2$, $SO_2$, CO, Na, $NO_2$, $N_2O$, and $H_2$, among any number of additional precursors.

Valves 266 may control the flow of the process gases from the sources 261, 262, 263, 264 from the gas panel 260 and may be managed by a controller 265. The flow of the gases supplied to the chamber body 205 from the gas panel 260 may include combinations of the gases form one or more sources. The lid assembly 210 may include a nozzle 214. The nozzle 214 may be one or more ports for introducing the process gases from the sources 261, 262, 264, 263 of the gas panel 260 into the chamber volume 201. After the process gases are introduced into the plasma processing chamber 200, the gases may be energized to form plasma. An antenna 248, such as one or more inductor coils, may be provided adjacent to the plasma processing chamber 200. An antenna power supply 242 may power the antenna 248 through a match circuit 241 to inductively couple energy, such as RF energy, to the process gas to maintain a plasma formed from the process gas in the chamber volume 201 of the plasma processing chamber 200. Alternatively, or in addition to the antenna power supply 242, process electrodes below the substrate 202 and/or above the substrate 202 may be used to capacitively couple RF power to the process gases to maintain the plasma within the chamber volume 201. The operation of the power supply 242 may be controlled by a controller, such as controller 265, that also controls the operation of other components in the plasma processing chamber 200.

A substrate support pedestal 235 may be disposed in the chamber volume 201 to support the substrate 202 during processing. The substrate support pedestal 235 may include an electrostatic chuck 222 for holding the substrate 202 during processing. The electrostatic chuck ("ESC") 222 may use the electrostatic attraction to hold the substrate 202 to the substrate support pedestal 235. The ESC 222 may be powered by an RF power supply 225 integrated with a match circuit 224. The ESC 222 may include an electrode 221 embedded within a dielectric body. The electrode 221 may be coupled with the RF power supply 225 and may provide a bias which attracts plasma ions, formed by the process gases in the chamber volume 201, to the ESC 222 and substrate 202 seated on the pedestal. The RF power supply 225 may cycle on and off, or pulse, during processing of the substrate 202. The ESC 222 may have an isolator 228 for the purpose of making the sidewall of the ESC 222 less attractive to the plasma to prolong the maintenance life cycle of the ESC 222. Additionally, the substrate support pedestal 235 may have a cathode liner 236 to protect the sidewalls of the substrate support pedestal 235 from the plasma gases and to extend the time between maintenance of the plasma processing chamber 200.

Electrode 221 may be coupled with a power source 250. The power source 250 may provide a chucking voltage of about 200 volts to about 2000 volts to the electrode 221. The power source 250 may also include a system controller for controlling the operation of the electrode 221 by directing a DC current to the electrode 221 for chucking and de-chucking the substrate 202. The ESC 222 may include heaters disposed within the pedestal and connected to a power source for heating the substrate, while a cooling base 229 supporting the ESC 222 may include conduits for circulating a heat transfer fluid to maintain a temperature of the ESC 222 and substrate 202 disposed thereon. The ESC 222 may be configured to perform in the temperature range required by the thermal budget of the device being fabricated on the substrate 202. For example, the ESC 222 may be configured to maintain the substrate 202 at a temperature of about −150° C. or lower to about 500° C. or higher depending on the process being performed.

The cooling base 229 may be provided to assist in controlling the temperature of the substrate 202. To mitigate process drift and time, the temperature of the substrate 202 may be maintained substantially constant by the cooling base 229 throughout the time the substrate 202 is in the chamber. In some embodiments, the temperature of the substrate 202 may be maintained throughout subsequent processes at temperatures between about −150° C. and about 500° C., although any temperatures may be utilized. A cover ring 230 may be disposed on the ESC 222 and along the periphery of the substrate support pedestal 235. The cover ring 230 may be configured to confine etching gases to a desired portion of the exposed top surface of the substrate 202, while shielding the top surface of the substrate support pedestal 235 from the plasma environment inside the plasma processing chamber 200. Lift pins may be selectively translated through the substrate support pedestal 235 to lift the substrate 202 above the substrate support pedestal 235 to facilitate access to the substrate 202 by a transfer robot or other suitable transfer mechanism as previously described.

The controller 265 may be utilized to control the process sequence, regulating the gas flows from the gas panel 260 into the plasma processing chamber 200, and other process parameters. Software routines, when executed by the CPU, transform the CPU into a specific purpose computer such as a controller, which may control the plasma processing chamber 200 such that the processes are performed in accordance with the present disclosure. The software routines may also be stored and/or executed by a second controller that may be associated with the plasma processing chamber 200.

Figure 3:
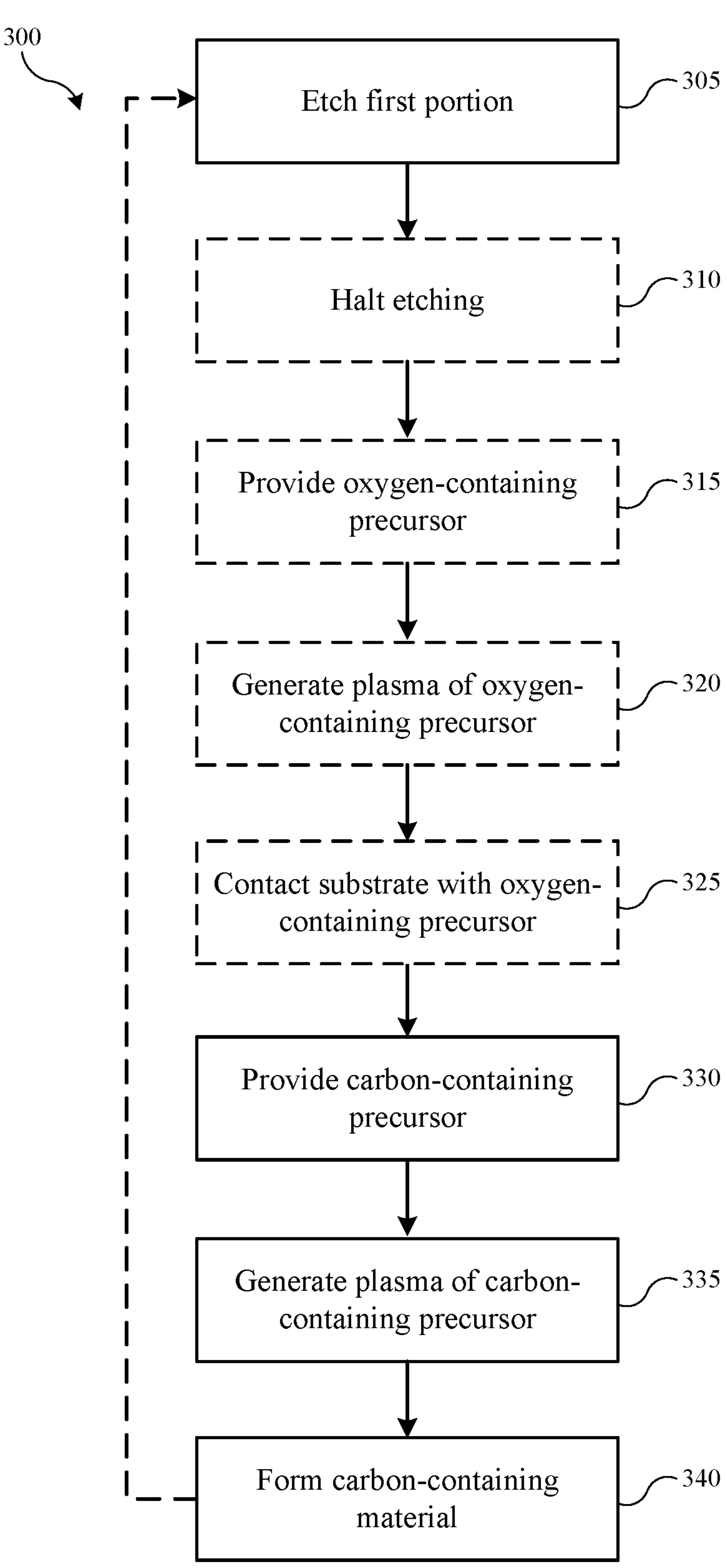
FIG. 3 shows selected operations in a formation method according to some embodiments of the present technology.

As noted above, the present technology may form a liner along the stack of layer pairs, which may protect overlying layers while etching proceeds through lower layers to the substrate level. Turning to FIG. 3 is shown exemplary operations in a method 300 for forming a semiconductor structure according to embodiments of the present technology. Method 300 may include one or more operations prior to the initiation of the method, including front-end processing, deposition, etching, polishing, cleaning, or any other operations that may be performed prior to the described operations. For example, the method may begin after a number of pairs of layers have been deposited for producing 3D NAND memory. However, as explained above, it is to be understood that the figures illustrate just one exemplary process in which molecular layer deposition according to embodiments of the present technology may be employed, and the description is not intended to limit the technology to this process alone. Some or all of the operations may be performed in chambers or system tools as previously described, or may be performed in different chambers on the same system tool, which may include the chamber in which the operations of method 300 may be performed.

Method 300 may include a number of optional operations as illustrated, which may or may not be specifically associated with some embodiments of methods according to the present technology. For example, many of the operations are described in order to provide a broader scope of the structural formation, but are not critical to the technology, or may be performed by alternative methodology as will be discussed further below. Method 300 describes operations shown schematically in FIGS. 4A-4E, the illustrations of which will be described in conjunction with the operations of method 300. It is to be understood that FIGS. 4A-4E illustrate only partial schematic views, and a substrate may contain any number of structural sections having aspects as illustrated in the figures, as well as alternative structural aspects that may still benefit from operations of the present technology.

Figure 4A:
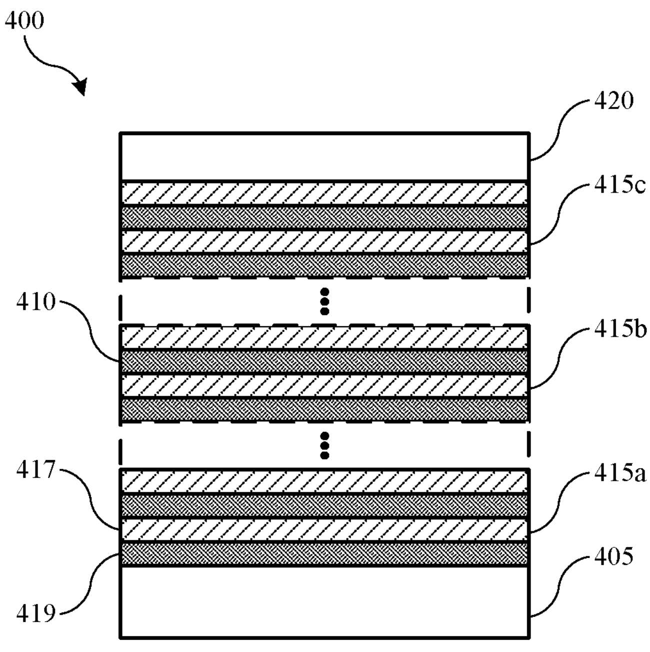
FIGS. 4A-4E illustrate schematic cross-sectional views of substrate materials on which selected operations are being performed according to some embodiments of the present technology.

Method 300 may or may not involve optional operations to develop the semiconductor structure to a particular fabrication operation. It is to be understood that method 300 may be performed on any number of semiconductor structures or substrates 405, as illustrated in FIG. 4A, including exemplary structures on which a selective deposition material may be formed. As illustrated in FIG. 4A substrate 405 may have a number of layers of material deposited overlying the substrate. Substrate 405 may be any number of materials, such as a base wafer or substrate made of silicon or silicon-containing materials, germanium, other substrate materials, as well as one or more materials that may be formed overlying the substrate during semiconductor processing.

Structure 400 may illustrate a partial view of a stack of alternating layers of materials, which in some embodiments may be used in 3D NAND memory formation. The alternating layers of material may be produced by any number of methods, including plasma-enhanced chemical vapor deposition, physical vapor deposition, atomic layer deposition, thermally enhanced chemical vapor deposition, or any other formation technique. In some embodiments, plasma-enhanced chemical vapor deposition may be performed in a processing chamber, such as processing chamber 200 described previously. Although the remaining disclosure will discuss stacks of alternating layers of silicon oxide and silicon nitride, embodiments of the present technology may use different combinations of materials, such as silicon oxide and silicon, silicon nitride and silicon, silicon and doped silicon, or any number of other materials. Although method 300 will discuss formation of silicon oxide followed by formation of silicon nitride, the formation order may be reversed in embodiments similarly encompassed by the present technology. Additionally, any number of layers of material may be produced in a stack, or any portion of any stack, and different portions of a stack may include more, less, or similar numbers of layers of any other portion of a stack according to embodiments of the present technology.

As illustrated in FIG. 4A, structure 400 includes a substrate 405 having a stack 410 of alternating layers of silicon oxide and silicon nitride. The illustrated stack 410 may include a number of portions 415, which may each include at least one layer of silicon oxide material 417, and at least one layer of silicon nitride material 419. Each portion may also include multiple pairs of layers including greater than or about 2 pairs, greater than or about 10 pairs, greater than or about 50 pairs, greater than or about 100 pairs, or more pairs of layers. Any specific number of pairs encompassed by any of these stated ranges is to be understood as if specifically stated here. Although three portions, 415*a*, 415*b*, and 415*c* are illustrated, more or less portions may be included according to some embodiments of the present technology.

In some embodiments, multiple portions, including all portions, may be formed during a single deposition sequence. This may avoid plugging and attempting to align memory holes between the sets as discussed above. Additionally, in some embodiments the portions may be produced in multiple operations. A mask material 420 may be formed over any of the portions of the stack prior to forming a portion of a memory hole or other feature, such as a recess or slit, through the structure. Structures according to the present technology may be characterized by any aspect ratios or the height-to-width ratio of the structure, although in some embodiments the materials may be characterized by larger aspect ratios, which may increase effects on aspects of the produced structure as described previously. For example, in some embodiments the aspect ratio of exemplary structures, such as the depth of the aperture or memory hole relative to the cross-sectional diameter, may be greater than or about 10:1, greater than or about 20:1, greater than or about 30:1, greater than or about 40:1, greater than or about 50:1, or greater. These high aspect ratios may frustrate many conventional etching operations or produce or exacerbate any of the issues described previously.

Once the layers have been formed, and a mask material 420 is deposited on the structure, memory holes may be etched through the structure. Method 300 may include partially etching through the stack of layers formed on the substrate at operation 305. The etch process may include providing one or more etchant precursors to a processing region of a semiconductor processing chamber and, in some embodiments, generating plasma effluents of the one or more etchant precursors. The etch process may be any type of etching, and in some embodiments may be or include a reactive-ion etch process as discussed above. In embodiments, the etchant precursors may include carbon-containing precursors, such as fluorocarbons, or oxygen-containing precursors, such as molecular oxygen. The etchant precursors may also include sulfur-containing precursors, such as carbonyl sulfide (COS), or fluorine containing precursors, such as nitrogen trifluoride ($NF_3$).

Figure 4B:
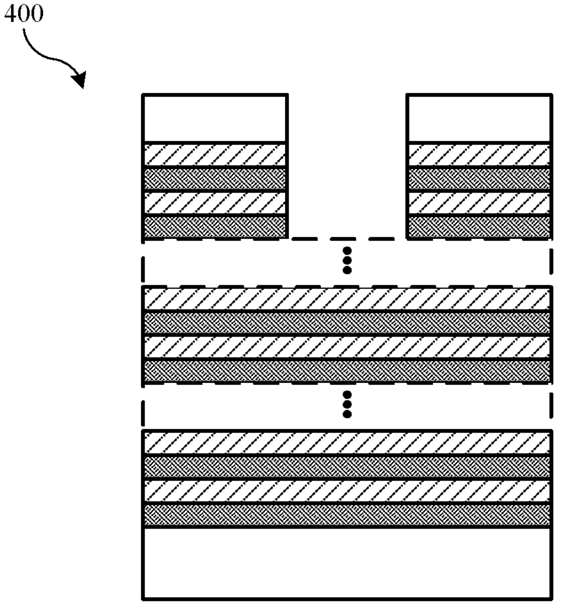

As illustrated in FIG. 4B, the initial etching operation may extend through the third portion 415*c* of the stack and, in embodiments, may at least partially extending through a second portion 415*b*. As illustrated, at some depth through the stack the etching process may be halted at optional operation 310, and this may occur prior to fully penetrating through the stack of layers. As illustrated in the figure, first portion 415*a* may not be etched during the initial etch process. The depth of the initial etch process may depend on the number of layer pairs, characteristics of the materials being etched, or any other aspect that may influence whether a critical dimension may be maintained through the etch. Prior to loss of critical dimension through the structure, the etching may be halted, which may occur at a depth of less than or about 75%, less than or about 50%, less than or about 25%, or less of a depth through the structure. In embodiments, the substrate may then be moved to a different chamber within a cluster tool, for example, which may allow vacuum to be maintained, although in some embodiments the substrate may be transferred between tools before forming a liner layer. However, in some embodiments, the substrate may not necessarily be moved and may be processed in the same chamber during each operation of method 300.

In embodiments, an optional flash operation may be performed subsequent to etching the first portion of the feature in the substrate. The flash operation may remove material buildup in the openings in the mask material 420. The buildup may be resultant from etched material redepositing as the stack 410 of alternating layers of silicon oxide and silicon nitride is removed, or from the one or more etchant precursors depositing on the mask material 420. In order to maintain critical dimension of the feature being etched into the substrate, the flash operation may remove any material altering the dimensions of the feature being etched. At optional operation 315, method 300 may include providing one or more flash precursors, such as an oxygen-containing precursor, which may be molecular oxygen (02), to the processing region of the semiconductor processing chamber. Plasma effluents of the oxygen-containing precursor may be generated at optional operation 320. The substrate may be contacted with the oxygen-containing precursor or the effluents thereof at optional operation 325, thereby removing etchant byproducts in or above the feature being etched. The flash precursors, such as the oxygen-containing precursor, may or may not include delivery of additional precursors, such as carrier gases. The inert precursor may include any inert material, such as helium, argon, xenon, or diatomic nitrogen ($N_2$).

Figure 4C:
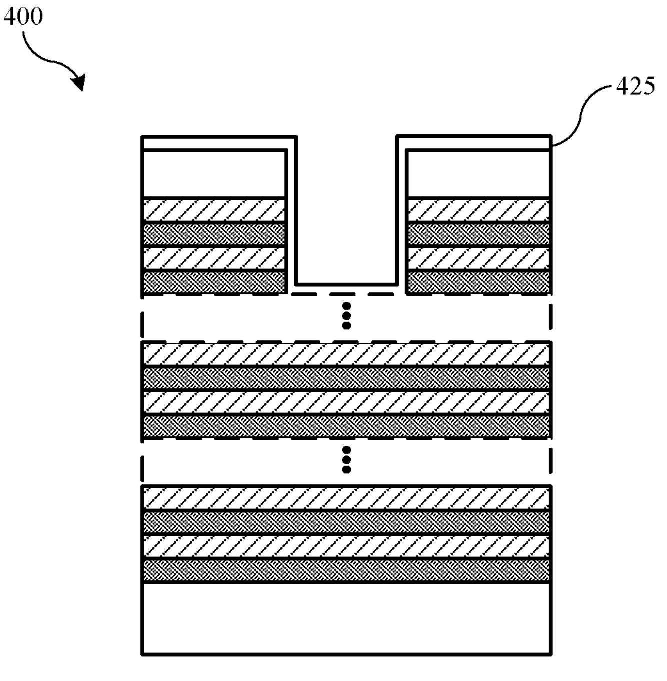

Method 300 may include forming a carbon-containing material along the stack of layers on the substrate. In some embodiments the formation may be substantially conformal along the etched portions of the layers, and on the mask. The deposition may be a plasma-enhanced deposition, which, unlike plasma-free deposition, may provide liner coverage of several nanometers or more, which may facilitate increased protection, as well as resistance to plasma exposure during subsequent etching. As illustrated in FIG. 4C, the liner layer 425 of carbon-containing material may be conformally formed within the etched feature and along the layers of material.

Forming the liner layer 425 may include providing a carbon-containing precursor at operation 330. Carbon-containing precursors that may be used in operation 330 may be or include any number of carbon-containing precursors. For example, any carbon-containing precursor for depositing a carbon-containing material, such as a polymeric carbon-containing material, may be used. As non-limiting examples, in embodiments of the present technology the carbon-containing precursor may also include fluorine and/or hydrogen. For example, the carbon-containing precursor may be a fluorocarbon. In embodiments, the carbon-containing precursor may be or include hexafluoropropylene ($C_3F_6$), octafluoropropane ($C_3F_8$), pentafluorocyclobutene ($C_4F_5$), hexafluorocyclobutene ($C_4F_6$), difluoromethane ($CH_2F_2$), acetylene ($C_2H_2$), 1,3,3,3-Tetrafluoropropene ($C_3H_2F_4$), or any other carbon-containing precursors.

The carbon-containing precursors may or may not include delivery of additional precursors, such as carrier gases or one or more oxygen-containing precursors, such as molecular oxygen, for depositing a carbon-and-oxygen-containing material. Although a carrier gas, such as an inert precursor, may be delivered with the deposition precursor, additional precursors intended to react with the deposition precursor and produce deposition products may not be used. The inert precursor may be any inert material, such as helium, argon, xenon, or diatomic nitrogen ($N_2$).

Once the carbon-containing precursor or precursors are provided to the processing region, the method 300 may include forming a plasma of the carbon-containing precursor within the processing region at operation 335. The plasma of the carbon-containing precursor may be generated at a plasma power of greater than or about 200 W, and may be generated at a plasma power greater than or about 300 W, greater than or about 400 W, greater than or about 500 W, greater than or about 600 W, greater than or about 700 W, greater than or about 800 W, greater than or about 900 W, greater than or about 1,000 W, greater than or about 1,100 W, greater than or about 1,200 W, greater than or about 1,300 W, greater than or about 1,400 W, greater than or about 1,500 W, or more. In embodiments, the plasma of the carbon-containing precursor may be generated at a plasma power of greater than or about 2,000 W, and may be generated at a plasma power less than or about 1,900 W, less than or about 1,800 W, less than or about 1,700 W, less than or about 1,600 W, less than or about 1,500 W, or less. In embodiments, a bias power may be provided while generating the plasma of the carbon-containing precursor. The bias power may be greater than or about 2,000 W, and may be greater than or about 3,000 W, greater than or about 4,000 W, greater than or about 5,000 W, greater than or about 6,000 W, greater than or about 7,000 W, or more. The bias power may direct the carbon-containing material to an etch front of the feature.

A plasma power, including both source and bias power, of greater than the previously discussed amounts may increase directionality of delivery of the carbon-containing precursor. This directionality may increase the vertical travel of the carbon-containing precursor performing a more conformal formation or deposition of a liner layer 425 throughout the entire etched feature at operation 340, as will be described below.

In embodiments, the plasma may be formed by pulsing RF power, instead of using continuous RF power. The RF power may cycle between cycles of being "on" and "off" repeatedly. During "on" cycles, the RF operating power may be greater than or about 200 W or less than or about 2,000 W. A pulsing frequency may be below about 10,000 Hz, and may be below about 7,500 Hz, below about 5,000 Hz, below about 2,500 Hz, below about 2,000 Hz, below about 1,500 Hz, below about 1,000 Hz, below about 750 Hz, below about 500 Hz, below about 250 Hz, or less. A duty cycle may be between about 5% and 95%, and may be between about 20% and about 80%, between about 30% and about 70%, between about 40% and about 70%, or between about 50% and about 70%. Pulsing the RF power may increase the ion density while maintaining the average ion energy, as compared to continuous RF power. Increased ion density may increase the density of the film while maintaining the amount of carbon-containing material deposited in the film.

As the carbon-containing precursor or the plasma effluents thereof are contacted with the structure 400, method 300 may include forming a liner layer 425 of carbon-containing material at operation 340. The liner layer 425 may line the first portion of the feature previously etched. The liner layer 425 of the carbon-containing material of some embodiments of the present technology may be formed to a thickness of greater than or about 1 nm, and may be formed to a thickness of greater than or about 5 nm, greater than or about 10 nm, greater than or about 15 nm, greater than or about 20 nm, greater than or about 50 nm, greater than or about 75 nm, greater than or about 100 nm, or more. However, the liner layer 425 may also be effective at reduced thicknesses, such as less than or about 50 nm, less than or about 45 nm, less than or about 40 nm, less than or about 35 nm, less than or about 30 nm, less than or about 25 nm, less than or about 20 nm, less than or about 15 nm, or less.

Figure 4D:
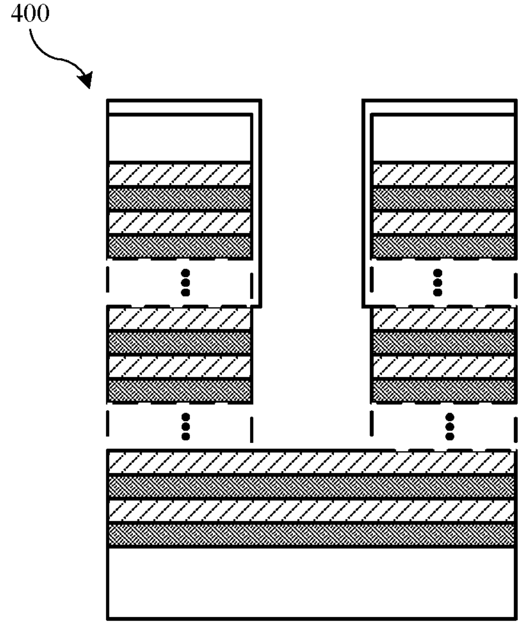
Figure 4E:
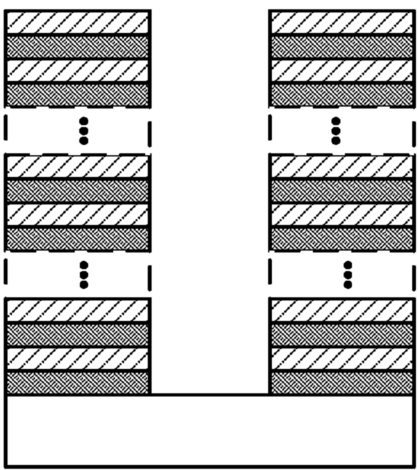

Once the layer of carbon-containing material has been formed overlying the material previously etched, method 300 may include a subsequent etch process. For example, if the substrate was moved in the previous operations, the substrate may be delivered back to the etch chamber, and the etch process may be resumed to etch the remaining portion of the stack at operation 305, which may etch fully through the stack of layers on the substrate. As shown in FIGS. 4D-4E, the etch process may continue and eventually fully extend through the remaining portions of the stack of layers, and may at least partially etch through the liner layer produced. Producing a liner layer 425 of carbon-containing material that may sufficiently protect the previously etched materials may be challenged by the ability of the materials to withstand the plasma etching during a subsequent etching operation. In some embodiments, the etch may fully remove the liner layer 425, although some portions or all of the liner layer 425 may remain along portions of the layers. Depending on the number of layers etched, in some embodiments a liner may be reformed after a second etch and proceeding a third etch. Any number of etch and liner formation sequences may be performed prior to exposing the substrate. For example, the etch and liner formation sequence may be repeated for two cycles, three cycles, four cycles, five cycles, six cycles, seven cycles, or more. The repeated formation of the liner layer 425 may also line and protect the mask material 420, which may allow the mask material 420 to remain for full etching of the feature.

The liner layer 425 formation may be able to maintain reducing critical dimensions of features being etched in semiconductor structures. For example, a critical dimension of the feature may be maintained at less than or about 550 nm, and may be maintained at less than or about 500 nm, less than or about 450 nm, less than or about 400 nm, less than or about 350 nm, less than or about 300 nm, less than or about 250 nm, less than or about 200 nm, less than or about 150 nm, or less.

If carbon-containing material does remain after the etch process is completed, the remaining material may be removed at optional operation 345. The removal or stripping may be performed with limited damage to the stack of layers by utilizing characteristics of the molecular layer materials that may be in contact with the stack of layers. For example, an oxidant may be delivered to the processing region to react with the carbon-containing material and etch an amount sufficient to remove the carbon-containing material. The oxidation may be plasma enhanced, such as by providing an oxygen-containing precursor and forming a plasma to produce oxygen radical species, which may etch the carbon-containing material. Additionally, ozone or some other reactive material to remove carbon-containing material may be used, and which may not be plasma enhanced, to limit additional damage to the structure. The removal process may also occur to strip the carbon-containing material with an anneal. While the carbon-containing materials may be stable during etching operations, the materials may still decompose at sufficient temperature. Accordingly, in some embodiments the material may be exposed to an anneal of greater than or about 200° C., and may be exposed to an anneal of greater than or about 250° C., greater than or about 300° C., greater than or about 350° C., greater than or about 400° C., greater than or about 450° C., greater than or about 500° C., greater than or about 550° C., greater than or about 600° C., or more. As illustrated in FIG. 4E, once the carbon-containing material has been removed, the structure may have a fully patterned number of layers, which may have all been deposited prior to any memory hole formation.

The deposition temperature of the materials may impact the deposition on the exposed materials, as well as the extent of conformal coverage. For example, lower temperatures may increase residence time of the deposition species, which may increase formation. Additionally, some materials may be more likely to flow during deposition, lowering the conformality of the coverage. Accordingly, in some embodiments, forming the carbon-containing materials may include specific materials delivered at a substrate temperature of less than or about 200° C., and the process may be performed at a temperature of less than or about 190° C., less than or about 180° C., less than or about 170° C., less than or about 160° C., less than or about 150° C., less than or about 140° C., less than or about 130° C., less than or about 120° C., less than or about 110° C., less than or about 100° C., less than or about 90° C., less than or about 80° C., less than or about 70° C., less than or about 60° C., less than or about 50° C., less than or about 40° C., less than or about 30° C., less than or about 20° C., less than or about 10° C., less than or about 0° C., less than or about −10° C., or less.

Deposition pressure may also impact the deposition on the exposed materials, as well as the extent of conformal coverage. For example, higher pressures may increase directionality of the carbon-containing precursor, which may increase conformality of the deposited material. Accordingly, in some embodiments, forming the carbon-containing materials may include specific materials delivered at a substrate temperature of less than or about 1 Torr, and may be less than or about 900 mTorr, less than or about 800 mTorr, less than or about 700 mTorr, less than or about 600 mTorr, less than or about 500 mTorr, less than or about 400 mTorr, less than or about 300 mTorr, less than or about 200 mTorr, less than or about 150 mTorr, less than or about 100 mTorr, or less.

In embodiments, the formation of the liner layer 425 of carbon-containing material may be performed at higher pressures than the etching process and flash process, such as the pressures previously discussed. The etching process and flash process may be performed at lower pressures, such as less than or about 100 mTorr, less than or about 90 mTorr, less than or about 80 mTorr, less than or about 70 mTorr, less than or about 60 mTorr, less than or about 50 mTorr, less than or about 40 mTorr, less than or about 30 mTorr, less than or about 20 mTorr, less than or about 10 mTorr, or less.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms “a”, “an”, and “the” include plural references unless the context clearly dictates otherwise. Thus, for example, reference to “a precursor” includes a plurality of such precursors, and reference to “the layer” includes reference to one or more layers and equivalents thereof known to those skilled in the art, and so forth.

Also, the words “comprise(s)”, “comprising”, “contain(s)”, “containing”, “include(s)”, and “including”, when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:

performing an etching process to etch a first portion of a feature in a substrate disposed within a processing region of a semiconductor processing chamber, wherein the first portion of the feature at least partially extends through one or more layers of material formed on the substrate;

halting the etching process;

subsequent to halting the etching process, providing a fluorocarbon-containing precursor to the processing region of the semiconductor processing chamber;

generating plasma effluents of the fluorocarbon-containing precursor;

contacting the substrate with the plasma effluents of the fluorocarbon-containing precursor;

forming a carbon-containing material on the substrate, wherein the carbon-containing material conformally lines the first portion of the feature at least partially extending through the one or more layers of material formed on the substrate;

halting a flow of the fluorocarbon-containing precursor and the forming of the carbon-containing material; and subsequent to halting the flow of the fluorocarbon-containing precursor and the forming of the carbon-containing material, etching a second portion of the feature that further extends through one or more layers of material formed on the substrate.

2. The semiconductor processing method of claim 1, wherein the feature is characterized by an aspect ratio of greater than or about 10:1.

3. The semiconductor processing method of claim 1, wherein the one or more layers of material formed on the substrate comprise alternating layers of oxide material and nitride material.

4. The semiconductor processing method of claim 1, further comprising:

subsequent to etching the first portion of the feature in the substrate, providing an oxygen-containing precursor; and contacting the substrate with the oxygen-containing precursor, wherein the contacting removes etchant byproducts in or above the feature.

5. The semiconductor processing method of claim 4, further comprising:

generating plasma effluents of the oxygen-containing precursor.

6. The semiconductor processing method of claim 1, wherein the plasma effluents of the fluorocarbon-containing precursor are generated at a plasma power of less than or about 2,000 W.

7. The semiconductor processing method of claim 1, further comprising:

applying a bias power while forming the carbon-containing material on the substrate, wherein the bias power directs the carbon-containing material to an etch front of the feature.

8. The semiconductor processing method of claim 1, further comprising:

providing an oxygen-containing precursor with the fluorocarbon-containing precursor, wherein the oxygen-containing precursor comprises molecular oxygen.

9. The semiconductor processing method of claim 1, wherein:

a temperature within the processing region is maintained at less than or about 150° C. during the semiconductor processing method; and a pressure within the processing region is maintained at less than or about 500 m Torr during the semiconductor processing method.

10. A semiconductor processing method comprising:

i) providing one or more etchant precursors to a processing region of a semiconductor processing chamber, wherein a substrate is disposed within the processing region of the semiconductor processing chamber;

ii) generating plasma effluents of the one or more etchant precursors;

iii) performing an etching process to etch a first portion of a feature in the substrate disposed within the processing region, wherein the first portion of the feature at least partially extends through one or more layers of material formed on the substrate;

iv) halting the etching process;

v) subsequent to halting the etching process, providing a flashing precursor to the processing region of the semiconductor processing chamber;

vi) removing etchant byproducts from the substrate;

vii) subsequent to removing etchant byproducts from the substrate, providing a carbon-containing precursor to the processing region of the semiconductor processing chamber;

viii) generating plasma effluents of the carbon-containing precursor;

ix) forming a carbon-containing material on the substrate, wherein the carbon-containing material lines the first portion of the feature at least partially extending through the one or more layers of material formed on the substrate; and x) subsequent to forming the carbon-containing material on the substrate, repeating operations i) through ix) for at least five cycles.

11. The semiconductor processing method of claim 10, wherein the one or more etchant precursors comprise an oxygen-containing precursor and a fluorine-containing precursor.

12. The semiconductor processing method of claim 10, wherein the carbon-containing precursor comprises a carbon-hydrogen-and-fluorine-containing precursor.

13. The semiconductor processing method of claim 10, further comprising:

providing argon to the processing region of the semiconductor processing chamber while providing the flashing precursor or providing the carbon-containing precursor.

14. The semiconductor processing method of claim 10, wherein a critical dimension of the feature is less than or about 550 nm.

15. The semiconductor processing method of claim 10, further comprising:

pulsing a plasma power during any of operations i) through viii), wherein a frequency of the plasma power is less than or about 500 Hz.

16. A semiconductor processing method comprising:

performing an etching process to etch a first portion of a feature in a substrate disposed within a processing region of a semiconductor processing chamber, wherein the feature at least partially extends through one or more alternating layers of material formed on the substrate;

halting the etching process;

subsequent to halting the etching process, providing a fluorocarbon precursor to the processing region of the semiconductor processing chamber;

generating plasma effluents of the fluorocarbon precursor, wherein the plasma effluents of the fluorocarbon precursor are generated at a plasma power of less than or about 1,500 W;

contacting the substrate with the plasma effluents of the fluorocarbon precursor;

forming a conformal polymeric carbon-containing material on the substrate, wherein the conformal polymeric carbon-containing material lines the feature at least partially extending through the one or more alternating layers of material formed on the substrate, and wherein a thickness of the conformal polymeric carbon-containing material is between about 5 nm and about 50 nm; and subsequent to forming a conformal polymeric carbon-containing material on the substrate, etching a second portion of the feature that further extends through one or more layers of material formed on the substrate.

17. The semiconductor processing method of claim 16, wherein the substrate comprises a mask material overlying the one or more alternating layers of material.

18. The semiconductor processing method of claim 16, wherein a thickness of the polymeric carbon-containing material is between about 10 nm and about 30 nm.

19. The semiconductor processing method of claim 16, wherein the feature is characterized by an aspect ratio of greater than or about 40:1.

* * * * *